(12) United States Patent
Yu et al.

(10) Patent No.: US 6,225,167 B1
(45) Date of Patent: May 1, 2001

(54) METHOD OF GENERATING MULTIPLE OXIDE THICKNESSES BY ONE OXIDATION STEP USING NH₃ NITRIDATION FOLLOWED BY RE-OXIDATION

(75) Inventors: Mo-Chiun Yu, Taipei; Wei-Ming Chen, Hsin-Chu, both of (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/523,988

(22) Filed: Mar. 13, 2000

(51) Int. Cl.⁷ .................. H01L 21/8234; H01L 21/31; H01L 21/469
(52) U.S. Cl. ............... 438/275; 438/769; 438/776; 438/775; 438/911
(58) Field of Search .................... 438/275, 770, 438/775, 711, 913, 769, 765

(56) References Cited

U.S. PATENT DOCUMENTS

| | | | |
|---|---|---|---|
| 5,254,489 | 10/1993 | Nakata | 437/40 |
| 5,330,920 | * 7/1994 | Soleimani et al. | 437/24 |
| 5,502,009 | 3/1996 | Lin | 437/239 |
| 5,834,351 | 11/1998 | Chang et al. | 438/266 |
| 5,891,798 | 4/1999 | Doyle et al. | 438/624 |
| 5,960,289 | 9/1999 | Tsui et al. | 438/275 |
| 5,989,962 | 11/1999 | Holloway et al. | 438/275 |
| 6,037,224 | * 3/2000 | Buller et al. | 438/258 |
| 6,080,682 | * 6/2000 | Ibok | 438/770 |

* cited by examiner

Primary Examiner—Richard Elms
Assistant Examiner—Adam Pyonin
(74) Attorney, Agent, or Firm—George O. Saile; Stephen B. Ackerman; Sevgin Oktay (57) ABSTRACT

A method is disclosed to form a plurality of oxides of different thicknesses with one step oxidation. In a first embodiment, a substrate is provided having a high-voltage cell area and a peripheral low-voltage logic area separated by a trench isolation region. The substrate is first nitrided. Then the nitride layer over the high-voltage area is removed, and the substrate is wet cleaned with HF solution. The substrate surface is next oxidized to form a tunnel oxide of desired thickness over the high-voltage. In a second embodiment, a sacrificial oxide is used over the substrate for patterning the high voltage cell area and the low-voltage logic area. The sacrificial oxide is removed from the low-voltage area and the substrate is nitrided after cleaning with a solution not containing HF, thus forming a nitride layer over the low-voltage area. Then, the sacrificial oxide is removed from the high-voltage area with an HF dip, and tunnel oxide of desired thickness is formed over the same area. In this manner, oxides of multiple thicknesses are provided for the high-voltage cell area and the low-voltage peripheral logic area with one oxidation step. At the same time, with a judicious use of cleaning and nitridation, any detrimental effects of the native oxide are circumvented.

18 Claims, 7 Drawing Sheets

METHOD OF GENERATING MULTIPLE OXIDE THICKNESSES BY ONE OXIDATION STEP USING NH$_3$ NITRIDATION FOLLOWED BY RE-OXIDATION

BACKGROUND OF THE INVENTION (1) Field of the Invention

The present invention relates to the manufacture of semiconductor devices in general, and in particular, to a method of using NH$_3$ nitridation followed by re-oxidation to generate different oxide thicknesses in a semiconductor device by one oxidation step.

(2) Description of the Related Art

Oxides in semiconductor devices play an extremely important role both in terms of providing a passive insulative barrier among various parts in the devices as well as performing an active function for the parts. Thus, simply separating different layers of metal from one another is an example of the former, while providing a particular capacitance value to a device is an example of the latter. Generally, a much greater portion of a semiconductor substrate comprises oxides, and therefore contributes to its size proportionately. Accordingly, forming oxides, with particular attention given to their dimensions, is important, especially in the field of ultra large scale integrated (ULSI) circuits, and semiconductor chips, as is well known. It is disclosed in the present invention a method of forming oxides of multiple thicknesses in one step.

More specifically, as semiconductor processing technologies advance, device geometries of integrated circuits are continually made smaller so that the device density of the entire system can be maximized. This results in, for example, transistors within integrated devices such as MOSFETS having shorter and shorter gate lengths. This in turn necessitates a reduction in gate oxide thickness and operating supply voltage in order to support the minimum gate length without excessively high threshold voltages. The minimum allowable gate oxide thickness for a given device is limited by the time dependent dielectric breakdown of the thin oxide at the desired operating voltage. As a result, the operating voltages applied to the gates of transistors within a particular device must be reduced as the gate oxides within these devices are reduced in thickness, as is known in the art.

Furthermore, it has become necessary to integrate different gate oxide thicknesses onto a single integrated circuit device. This is because, high performance transistors require thinner gate dielectric regions and operate at lower voltages (e.g. 1.8 volts to 2.5 volts), whereas most conventional external peripherals typically require higher operating voltages such as 3.3 volts to 5.0 volts. When interfacing lower voltage high performance MOS transistors to higher voltage devices, input and output (I/O) buffers of the integrated circuit (IC) are typically designed to contain thicker gate dielectric regions that are compatible with the higher external peripheral device voltages. In addition, current microcontroller units (MCUs) and digital signal processors (DSPs) are integrating several different types of technology onto a single integrated circuit. For example, high speed logic, power logic, static random access memory (SRAM), nonvolatile memory (NVM), embedded dynamic random access memory (DRAM), analog circuitry, and other devices and technologies are now being considered for integration onto the same integrated circuit die. Many of these devices require different gate dielectric processing and different gate dielectric thicknesses.

Forming of gate oxide layers having two different thicknesses on the same substrate can be difficult. Conventionally, photolithographic techniques are employed to pattern separately the oxides that are to have different thicknesses. It is often the case, however, that with the required two different oxide thicknesses, there are times when a photoresist mask is placed in proximity to the bare semiconductor substrate. The photoresist is known to cause degradation of the surface of the substrate, which is not desirable especially in the area intended to be used for high performance transistors. In its place, Holloway, et al., in U.S. Pat. No. 5,989,962 disclose a method of using nitride as a mask. Specifically, a gate insulator (oxide) is formed. The outer surface of the gate insulator is then masked such that only the portions of the gate insulator layer to be used for low voltage devices are exposed. The exposed portion of the gate insulator layer is then processed to create a nitride layer. The masking material is then removed. An additional gate insulator layer is then grown to increase the thickness of the dielectric of the portion of the insulator layer associated with high voltage devices. The nitride layer is used to advantage because of its characteristics to inhibit the growth of the underlying oxide in the area of the insulator layer to be used for low voltage devices.

The advantages of using a nitride or an oxynitride layer to self-limit the growth of the proximate oxide layer is known in the art, and it has been used for enhancing the physical and electrical properties of tunnel oxides. As is known, tunnel dielectric layer is used to separate the floating gate of a memory cell from the channel in the substrate and hold the charge transferred into the floating gate. Reducing the thickness of the tunnel dielectric is of primary importance to the development of high density nonvolatile memory devices. With all methods for transferring a charge to a floating gate depends upon the capacitance between the floating gate and the control gate which, in turn, depends upon the thickness of the tunnel dielectric layer. In order to minimize the amount of energy needed to transfer a charge into and out of the floating gate, as well as to minimize the amount of heat generated by the device during programming, it is desirable to minimize the thickness of the tunnel dielectric layer. One common approach is to form an oxynitride layer at the silicon-oxide interface during fabrication of the memory cells. The presence of the oxynitride layer limits the oxidation of silicon and thus enables a silicon dioxide layer of a limited thickness to be grown. This results in a thinner tunnel oxide, including improved physical properties.

Chang, et al., of U.S. Pat. No. 5,834,351 point out, however, that formation of oxynitride layer during fabrication of the memory cells has the disadvantage of introducing nitrogen particles embedded in oxides, such as in field oxides separating individual transistors from each other in a substrate, and in areas peripheral to the regions of the device where memory cells are being formed. In these peripheral regions, the residual nitrogen limits the growth of silicon dioxide in subsequent oxide growth processes. For example, the presence of residual nitrogen can cause thinning of peripheral gate oxide formation adjacent field oxides. Thinning of peripheral gate oxides can cause earlier breakdown in the peripheral circuits which is not desirable. Thus, in order to prevent the neighboring regions from this "nitrogen contamination", Chang, et al., disclose a process where they confine the oxynitride layer to the desired regions of the integrated circuit only. For this purpose, an oxynitride layer is selectively formed in a memory array region without leaving residual oxynitride layers in regions peripheral to the memory array region. In one approach to the process, an oxynitride is selectively formed in a memory array region such that little or no oxynitride is formed in peripheral regions. In an alternate approach, any oxynitride layers formed in peripheral regions are selectively removed.

Figure 1A:
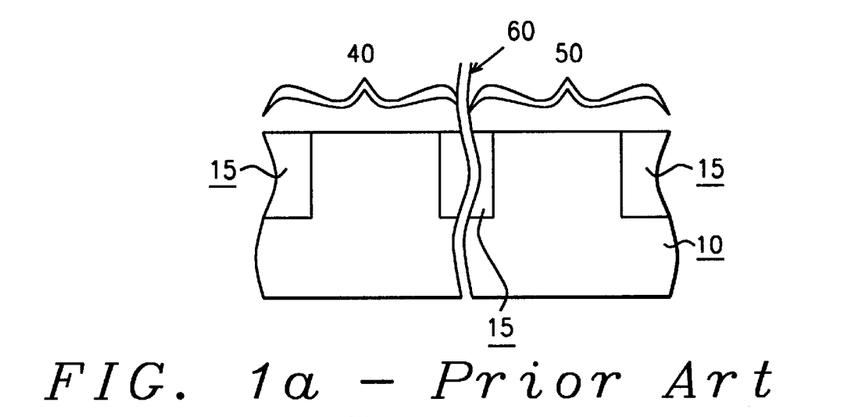
FIG. 1a is a cross-sectional view of a portion of a semiconductor substrate showing a high-voltage (HV) cell area and a low-voltage (LV) logic area separated by a shallow trench isolation (STI) region, according to prior art.

A conventional method of forming two different gate oxide thicknesses in two different active areas is illustrated in FIGS. 1a–1d. FIG. 1a shows a partial cross-section of a semiconductor substrate, (10). Trench isolation regions (15) are formed within select portions of the substrate (10). The trench isolation regions (15) separate many active areas of the substrate (10), two of which are illustrated in FIG. 1a. Specifically, FIG. 1a illustrates a first active area (50) that is separated from a second active area (40) by one or more trench isolation regions (15), as delineated by phantom line (60) in FIG. 1a.

Figure 1B:
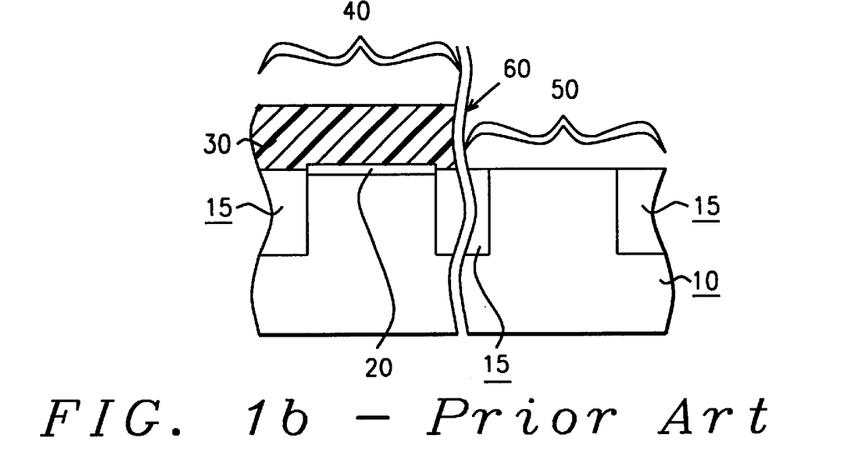
FIG. 1b is a cross-sectional view of a portion of a semiconductor substrate showing the patterning of a first oxide layer with a photoresist mask, according to prior art.
Figure 1C:
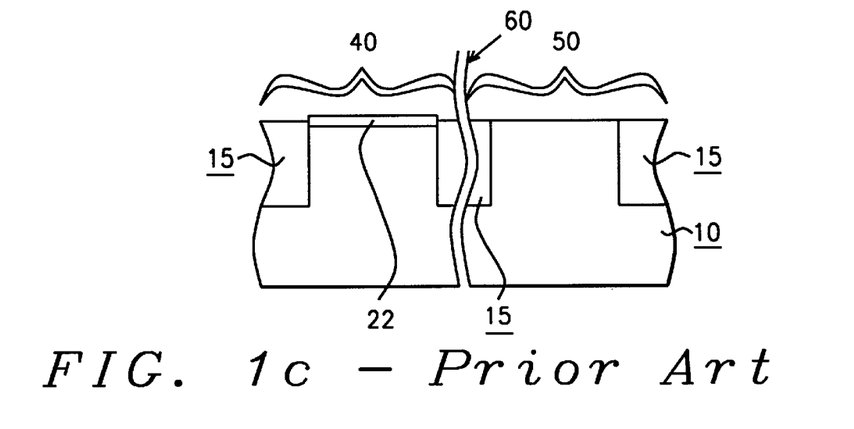
FIG. 1c is a cross-sectional view of a portion of a semiconductor substrate showing the forming of a first oxide layer over the HV area of the substrate, according to prior art.

An oxide layer (20) is next formed over the substrate, including both active areas (50) and (40) shown in FIG. 2. After layer (20) is formed across the entire wafer in both active areas (50) and (40), a photoresist mask (30) is formed to protect the portion of the layer (20) lying within the active area (40). Since layer (30) does not overlay the active area (50), any portion of layer (20) located within the active area (50) is exposed to subsequent processing ambients. An oxide etch ambient is then used to etch layer (20) from the top surface of active area (50) while layer (30) protects the underlying layer (20) from the etch ambient. Thus, as shown in FIG. 1b, dielectric layer (20) has been removed from the top surface of active area (50), while layer (20) on active area (40) remains.

Next, an oxygen-ash process is used to remove photoresist layer (30) from the surface of substrate (10). The oxygen-ash process involves ion bombardment, and this ion bombardment will convert oxide layer (20) within active area (40) to a damaged oxide layer (22). The damaged layer (22) is damaged due to the ion bombardment needed to remove the photoresist layer (30) in a manner similar to the damage caused to exposed layers by low energy ion implantation. Following ashing photoresist removal, a conventional RCA cleaning process is used to clean the surface of active area (50). The RCA cleaning process involves oxide etch chemicals, such as HF, and as will be known to those skilled in the art, HF will remove unevenly the exposed surface portions of layer (22). This will cause non-uniform distribution of oxide within the same active area, (40). It will also be obvious that the uneven and partial removal of the oxide will vary from wafer to wafer, which will result in variable device characteristics, such as for MOS on-current (Id), threshold voltage (Vt), leakage current, charge-to-breakdown (Qbd) and other parameters. In addition, the oxygen plasma of the ashing process as well as etching in general will degrade the quality of oxide layer (22) in active area (40) substantially.

Figure 1D:
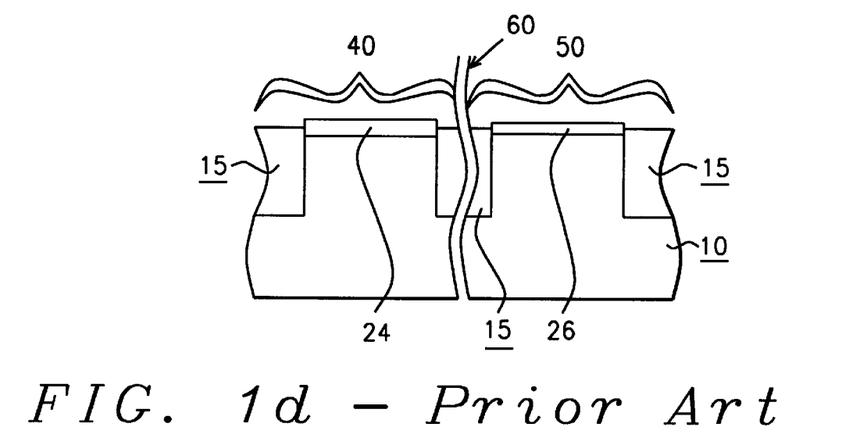
FIG. 1d is a cross-sectional view of a portion of a semiconductor substrate showing the forming of a second oxide layer over the LV area of the substrate, according to prior art.

After the removal of the photoresist material, the entire wafer is subjected to thermal oxidation to form a thin oxide layer (26) within active area (50). This oxidation slightly thickens layer (22) in active area (40) to form a thickened oxide layer (24) as shown in FIG. 1d. Due to the previous oxide bombardment damage and non-uniformity resulting within layer (22), layer (24) is also non-uniform, damaged, and has compromised gate oxide integrity as discussed above. The lack of gate oxide integrity for layer (24) makes it is difficult to control MOS transistor performance in active area (40) both wafer-to-wafer and across a single wafer.

To alleviate the above concerns, as discussed by Tsui, et al., in U.S. Pat. No. 5,960,289, the inventors in the same patent propose a method for making dual-thickness gate oxide layer using a nitride/oxide composite region. First, a first oxide layer is formed within a first and second active areas. A protective layer is then formed over the oxide layer. A mask is used to allow removal of the protective and oxide layers from the active area. A thermal oxidation process is then used to form a thin second oxide layer within the first active area. Conductive gate electrodes are then formed wherein the first oxide layer and the protective layer are incorporated into the gate dielectric layer of a MOS transistor. The transistor in the second active area gains a thinner gate oxide layer without the protective layer. Thus, a dual-thickness gate oxide layer is provided.

Lin discloses another method for fabricating gate oxide layers of different thicknesses in U.S. Pat. No. 5,502,009. A first oxide layer is formed on a predetermined portion of a silicon substrate to define first active regions and second active regions. A first gate oxide layer is formed over the first and second active regions. A barrier layer is formed to cover portion of the first gate oxide layer within the first active regions. The portion of the first gate layer within the second active regions is then removed utilizing the barrier layer as masking. A second gate oxide layer is then formed over the second active regions.

Another method of manufacturing semiconductor device by forming first and second oxide films is disclosed by Nakata in U.S. Pat. No. 5,254,489 by use of nitridation. According to the invention, an element region and an element isolation region are formed on a semiconductor substrate of a first conductivity type. A first oxide film serving as a gate insulating film is formed in the element region. Thermal oxidization is performed after annealing is performed in nitrogen or ammonia atmosphere to nitrify an entire surface of the first oxide film. A predetermined region of a nitrified first oxide film is removed, and a second oxide film serving as a gate insulating film is formed in the predetermined region using the nitrified first oxide film as a mask. A gate electrode constituted by a polysilicon film is formed don each of the nitrified first oxide film and the second oxide film.

Also, a method for forming an insulator with a high dielectric constant on silicon is disclosed by Doyle in U.S. Pat. No. 5,891,798. First, nitrogen is implanted in a silicon substrate through a sacrificial oxide layer. After annealing the substrate and stripping the sacrificial oxide, a dielectric layer is formed from a material with a high dielectric constant, such as a paraelectric material. A gate electrode is next formed on the dielectric layer, and nitrogen implanted into the gate electrode is used to prevent oxidation at the upper interface of the gate dielectric.

It is shown in the present invention that conventional methods of forming multiple thickness oxides can cause implant damage in the gate oxide if direct nitrogen implant into the silicon substrate is used. Furthermore, conventional methods of using photoresist to protect one area while promoting oxide growth in an adjacent area can impact the integrity of the surface on which the oxide is grown. What is needed, therefore, is a method where multiple thickness oxides can be grown in one step without the need for photoresist protection and without direct nitrogen implant in controlling the oxide growth.

SUMMARY OF THE INVENTION

It is therefore an object of this invention to provide method of forming oxides of different thicknesses with one oxidation step.

It is another object of this invention to provide a method for forming gate oxides of different thicknesses in order to be able to integrate both high-voltage and low-voltage devices on the same substrate.

It is still another object of the present invention to provide a method of alleviating the detrimental effects of native oxide in forming gate oxides for high-voltage and low-voltage devices on the same substrate.

It is yet another object of the present invention to provide a nitridation method for forming oxides of different thicknesses, and at the same time, a nitrogen rich gate oxide in order to prevent boron penetration and the attendant mobility degradation.

These objects are accomplished by providing a substrate having a first active area and a second active area separated by a trench isolation region; performing nitridation to form a nitride layer over said substrate including over both said first and second active areas; forming a masking layer over said nitride layer to protect a portion of said nitride layer overlying said second active area; etching a portion of said nitride layer over said first active area not protected by said masking layer; removing said masking layer; wet cleaning said substrate including said first and second active areas; and performing oxidation over said substrate including over said first and second active areas to form a tunnel oxide in one oxidation step over said first active area.

These objects are further accomplished in a second embodiment by providing a substrate having a first active area and a second active area separated by a trench isolation region; forming a sacrificial oxide layer over said substrate including over said first and second active areas; patterning said sacrificial oxide layer to remove a portion of said sacrificial oxide from over said second active area while leaving a portion of said sacrificial oxide layer over said first active area; wet cleaning said substrate including said first and second active areas; performing nitridation to form a nitride layer over said substrate; removing said sacrificial oxide layer from over said first active area; performing oxidation over said substrate including over said first and second active areas to form a tunnel oxide in one oxidation step over said first active area.

DESCRIPTION OF THE PREFERRED EMBODIMENTS

Referring now to the drawings, FIGS. 2a–2e show the forming of gate oxides of two different thickness with two different oxidation steps, as currently practiced in the present manufacturing line. The preferred method of forming multiple oxides having different thicknesses, but with one oxidation step, is shown in two embodiments in FIGS. 3a–3e and FIGS. 4a–4f.

Figure 2A:
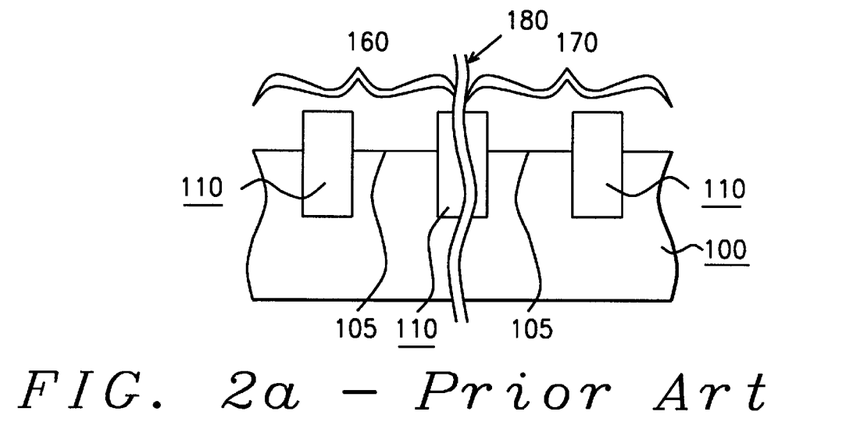
FIG. 2a is a cross-sectional view of a portion of a semiconductor substrate showing a high-voltage (HV) cell area and a low-voltage (LV) logic area separated by a shallow trench isolation (STI) region, according to the current practice in the present manufacturing line.

With current practice, substrate (100) is provided with a high-voltage area (160) and a low-voltage area (170) separated by a trench isolation region (110) as shown in FIG. 2a. The separation of the two regions is delineated by phantom line (180) in FIGS. 2a–2e. High-voltage, or "HV" hereafter, area is usually reserved for the cell area of the embedded non-volatile memory and low-voltage (LV) area for the peripheral advanced logic of a sub-micron CMOS device.

Figure 2B:
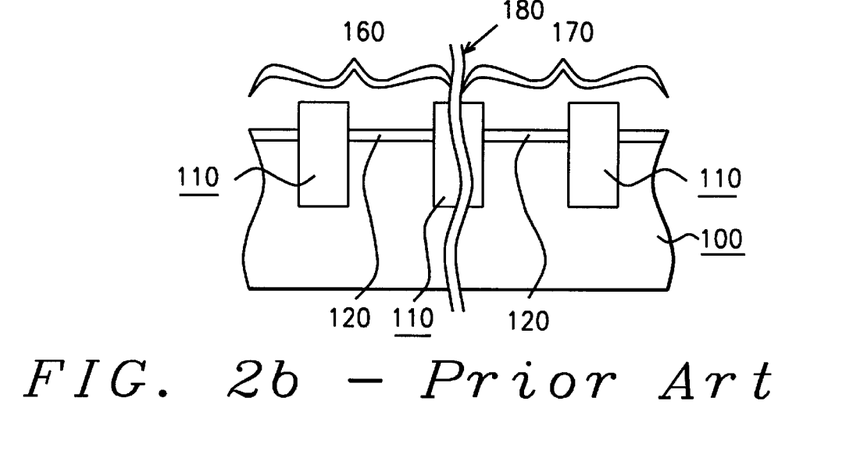
FIG. 2b is a cross-sectional view of a portion of a semiconductor substrate showing the forming of a first oxide layer, according to the current practice in the present manufacturing line.
Figure 2C:
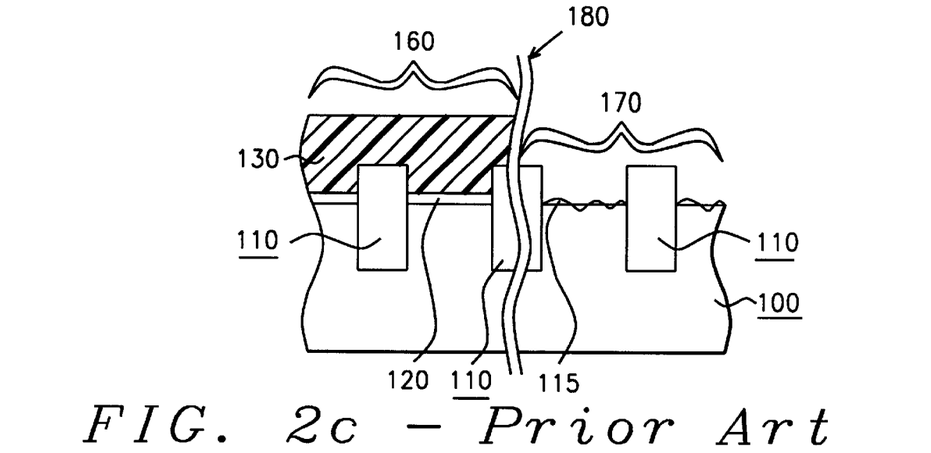
FIG. 2c is a cross-sectional view of a portion of a semiconductor substrate showing the patterning of the first oxide layer of FIG. 2b, according to the current practice in the present manufacturing line.
Figure 2D:
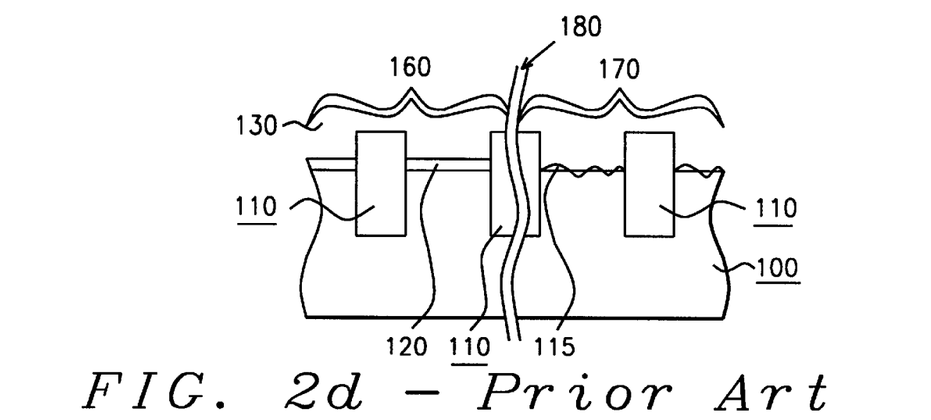
FIG. 2d is a cross-sectional view of a portion of a semiconductor substrate showing the residual native oxide over the LV area of the substrate of FIG. 2a, according to the current practice in the present manufacturing line.

First, substrate (100) is cleaned and a first gate oxide (120) is grown over the substrate, including both the HV (160), and HV (170) areas, as shown in FIG. 2b. Then, a photoresist mask is formed and patterned so as to protect the HV area during removal of the first oxide layer from the LV area, as shown in FIG. 2c. The removal of the oxide layer is accomplished by etching, which is known to attack the underlying surface and cause damage as indicated by reference numeral (115) in FIG. 2c. Furthermore, when at the next step, photoresist mask (130) is removed by oxygen plasma ashing, the damage on the LV area can be exacerbated by ion bombardment. The damage can become even more pronounced when the substrate is next cleaned with chemicals containing HF, hydrogen fluoride, which will remove unevenly the exposed portions of the surface, as shown in FIG. 2d.

Figure 2E:
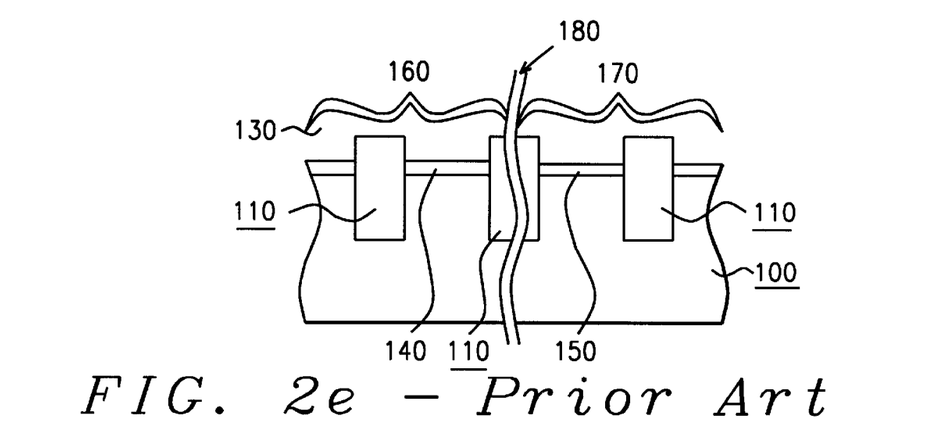
FIG. 2e is a cross-sectional view of a portion of a semiconductor substrate showing a second oxidation step for growing a second oxide layer, according to the current practice in the present manufacturing line.

After removal of the photoresist mask, substrate (100) is subjected to thermal oxidation to form a thin second oxide layer (150) in the LV area. This over-all oxidation thickens first oxide layer (120) to form the needed thicker gate oxide (140) for the HV cell area. However, due to the previous oxide damage and non-uniformity (115) resulting within layer (150), the integrity of the gate oxide becomes diminished. It will be known to those skilled in the art that if HF is avoided in order to prevent the uneven removal of the oxide during surface cleaning, a cleaning agent without the HF will leave native oxide on the surface, which in turn will have detrimental effects on the subsequent process steps. A subsequent step involves, for example, a post oxidation anneal with $N_2O/NH_3$ which helps prevent boron penetration into the gate oxide and the substrate when doped polysilicon gate is next formed over the gate oxide (not shown).

A preferred method of forming gate oxides having two different thicknesses with one oxidation step on the same substrate is shown in FIGS. 3a–3e. The regions requiring two different oxide thicknesses are delineated by phantom line (280) in the same FIGS.

Figure 3A:
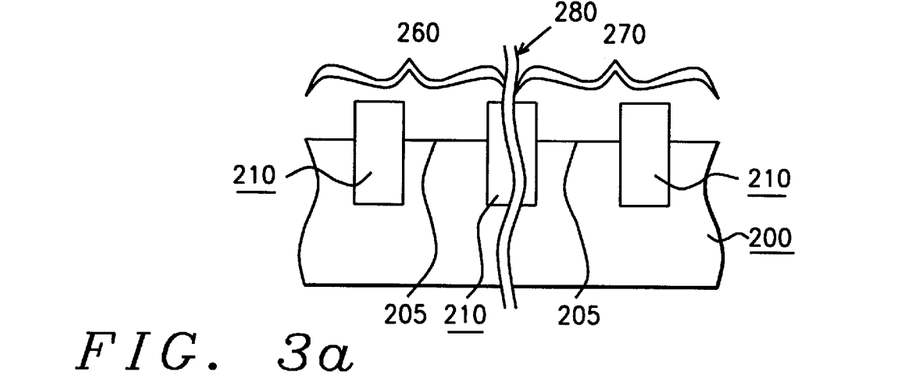
FIG. 3a is a cross-sectional view of a portion of a semiconductor substrate showing a high-voltage (HV) cell area and a low-voltage (LV) logic area separated by a shallow trench isolation (STI) region, according to the first embodiment of the present invention.
Figure 3B:
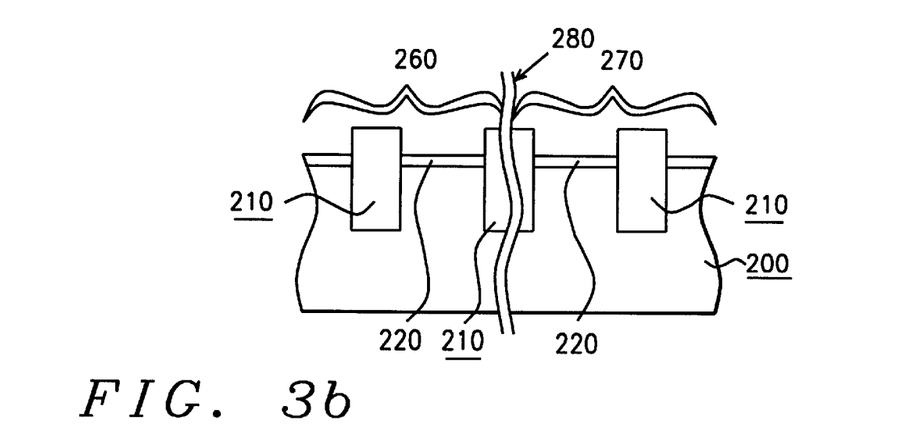
FIG. 3b is a cross-sectional view of a portion of a semiconductor substrate showing the forming of a nitride layer, according to the first embodiment of the present invention.

In FIG. 3a, substrate (200) is provided with high-voltage HV (260) and low-voltage LV (270) areas separated by shallow trench isolation (STI) regions (210) following conventional methods. The substrate is cleaned with an HF solution to remove any native oxide from surface (205). Next, as a main feature and key aspect of the first embodiment, the surface is subjected to nitridation using ammonia ($NH_3$) in an RTP (rapid thermal processing equipment) at a temperature between about 600 to 1000° C. forming nitride layer (220) having a thickness between about 10 to 30 Å, as shown in FIG. 3b.

Figure 3C:
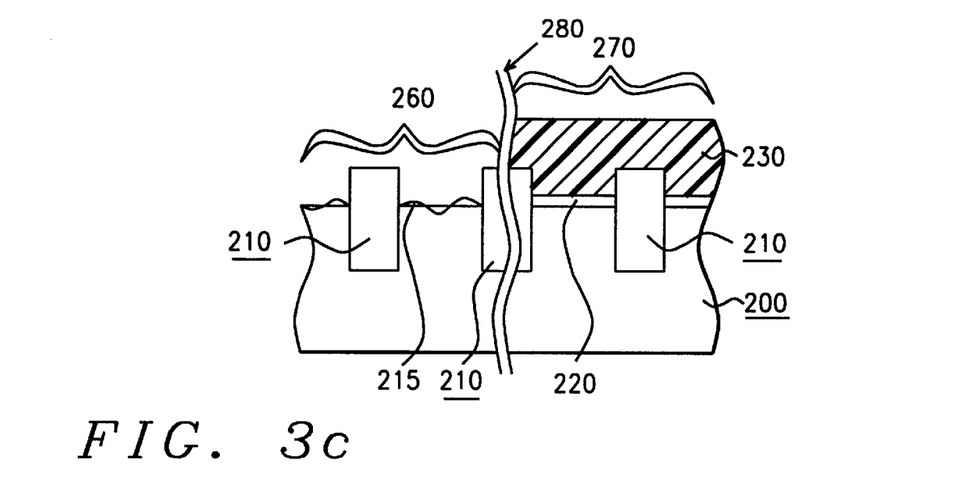
FIG. 3c is a cross-sectional view of a portion of a semiconductor substrate showing the patterning of the nitride layer of FIG. 3b over the LV area of FIG. 3a, according to the first embodiment of the present invention.

Then a layer of photoresist (230) is formed and patterned with an opening over the HV area as shown in FIG. 3c. It is preferred that the thickness of the photoresist layer is between about 1.0 to 3.0 micrometers ($\mu$m). The nitride layer exposed in HV area (260) is etched until substrate surface is reached. The etching of the nitride layer is accomplished by hot $H_3PO_4$ wet etch. Subsequently, the photoresist material is removed by oxygen plasma ashing followed by cleaning of the substrate with an HF solution.

Figure 3D:
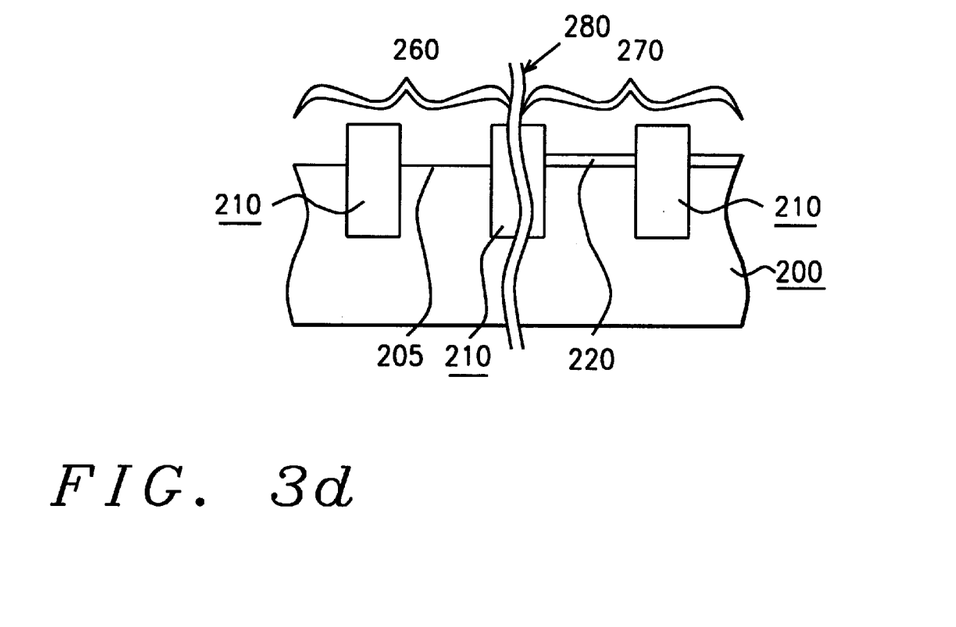
FIG. 3d is a cross-sectional view of a portion of a semiconductor substrate showing the cleaning of the native oxide over the LV area of the substrate, according to the first embodiment of the present invention.
Figure 3E:
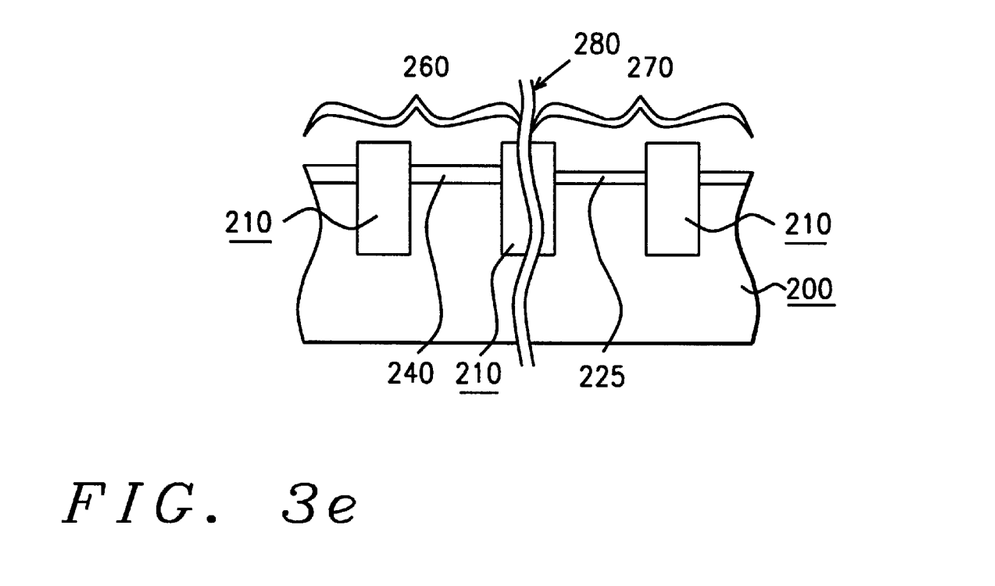
FIG. 3e is a cross-sectional view of a portion of a semiconductor substrate showing the forming of two different oxide layers of two different thicknesses over the HV and LV areas of the substrate of FIG. 2a with one oxidation step of the present invention.

The cleaning removes any damage and native oxide (215) present on surface (205) as shown in FIG. 3d. Then, as a key aspect of the invention, a one-step thermal oxidation of the entire substrate is performed with gases $H_2$ and $O_2$ at a temperature between about 600 to 1000° C., to form tunnel oxide (240) in the high-voltage HV area (260) shown in FIG. 3e. It will be noted that the presence of nitride layer (220) in the low-voltage LV area (270) limits the oxidation of silicon in the underlying substrate and thus enables a silicon dioxide layer of a limited thickness to be grown. This nitride rich oxide layer (225) is especially desirable for preventing boron penetration into the substrate at the subsequent steps of forming a polysilicon gate (not shown).

Figure 4A:
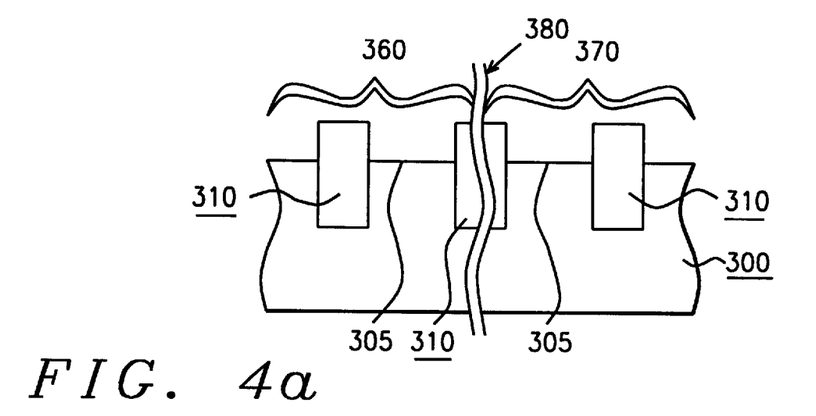
FIG. 4a is a cross-sectional view of a portion of a semiconductor substrate showing a high-voltage (HV) cell area and a low-voltage (LV) logic area separated by a shallow trench isolation (STI) region, according to the second embodiment of the present invention.
Figure 4B:
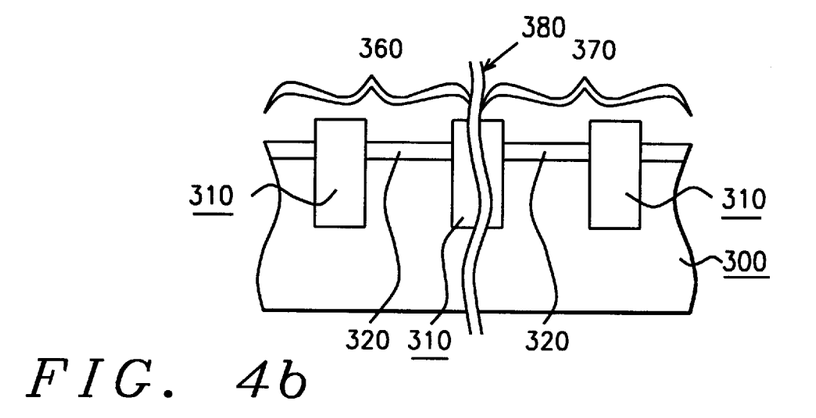
FIG. 4b is a cross-sectional view of a portion of a semiconductor substrate showing the forming of a sacrificial oxide layer over the HV and LV areas of the substrate of FIG. 4a, according to the second embodiment of the present invention.

In a second embodiment, shown in FIGS. 4a–4f, nitridation is introduced at a later step. As before, substrate (300) is provided with high-voltage (HV) area (360) and low-voltage (LV) area (370) separated by shallow trench isolation (STI) region (310). The separation of the two regions is delineated by phantom line (380) in FIGS. 4a–4f. First, substrate shown in FIG. 4a is cleaned with a solution containing HF in order to remove any pre-existing native oxide on surface (305). Then, sacrificial oxide layer (320) is grown on the entire surface of the substrate as shown in FIG. 4b. The preferred method of forming the sacrificial oxide is by thermal oxidation in dry oxygen carried out in an oxidation furnace in a temperature range between about 6000 to 1000° C. Alternatively, other oxidation methods can be used, such as oxidation in a dry oxygen and anhydrous hydrogen chloride in an atmospheric or low pressure environment, or low temperature, high-pressure, and the like. The preferred thickness of the sacrificial oxide layer is between about 50 to 80 Å.

Figure 4C:
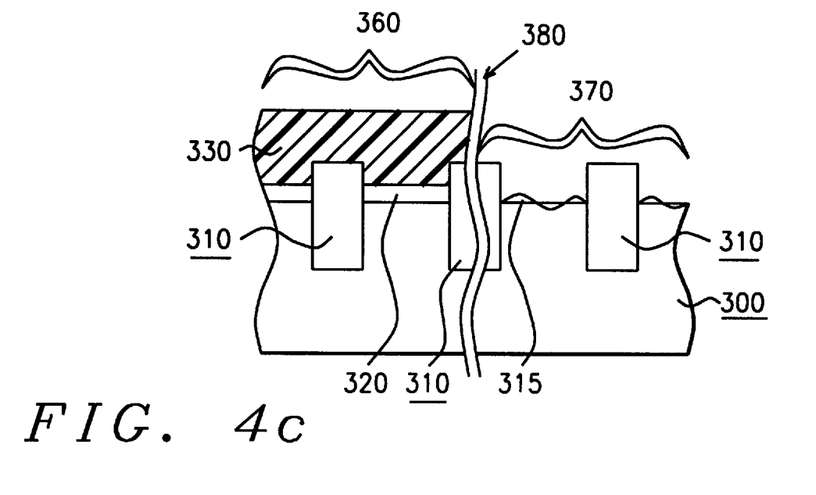
FIG. 4c is a cross-sectional view of a portion of a semiconductor substrate showing the patterning of the sacrificial oxide layer of FIG. 4b over the LV area of FIG. 4a, according to the second embodiment of the present invention.
Figure 4D:
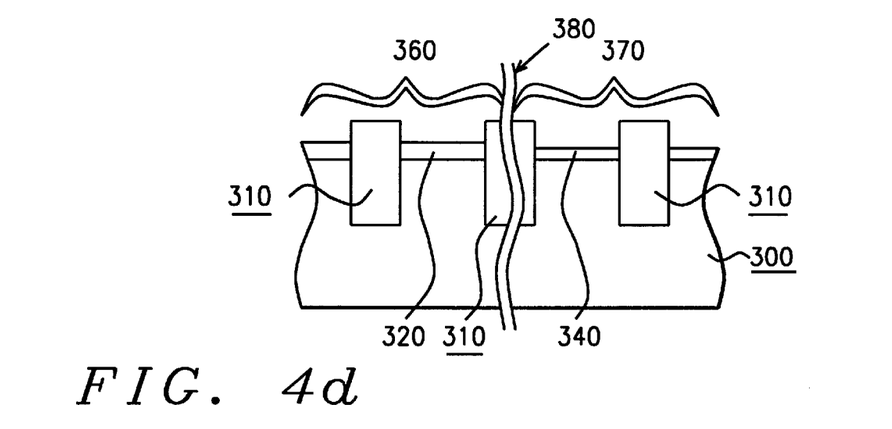
FIG. 4d is a cross-sectional view of a portion of a semiconductor substrate showing the nitridation of the LV area of the substrate of FIG. 4a, according to the second embodiment of the present invention.

Next, a photoresist mask, (330) in FIG. 4c, is formed over the substrate and patterned with an opening over LV area (370) as shown in the same FIG. The now exposed sacrificial oxide layer over the LV area is removed by etching, followed by the removal of the photomask. Etching of the oxide is accomplished with a recipe comprising $OH_2:H_2O$ (10:1). At the next step, wet cleaning of the substrate is performed without HF. Then, as a main feature and key aspect of the second embodiment, nitridation of the substrate surface is performed to form nitride layer (340) as shown in FIG. 4d. Nitridation is accomplished by using ammonia ($NH_3$) in an RTP (rapid thermal processing equipment) at a temperature between about 600 to 1000° C. The preferred thickness of nitride layer (340) is between about 10 to 30 Å.

Figure 4E:
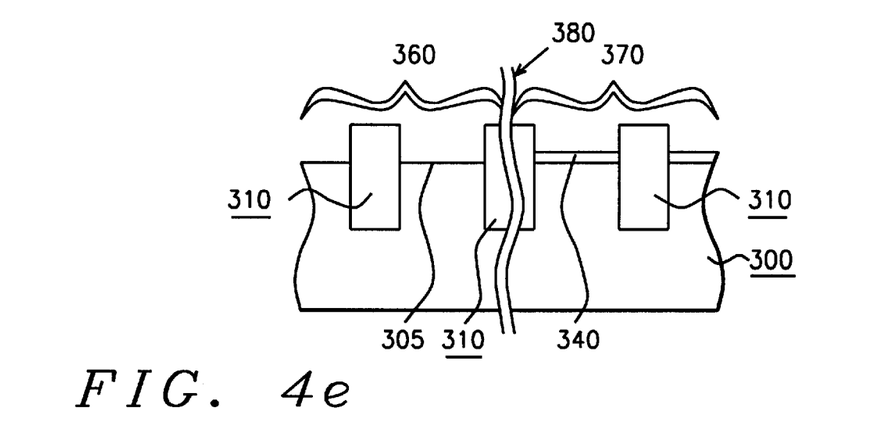
FIG. 4e is a cross-sectional view of a portion of a semiconductor substrate showing the reclaiming of the HV area of FIG. 4a by removing the oxide layer of FIG. 4d using an HF dip, according to the present invention.
Figure 4F:
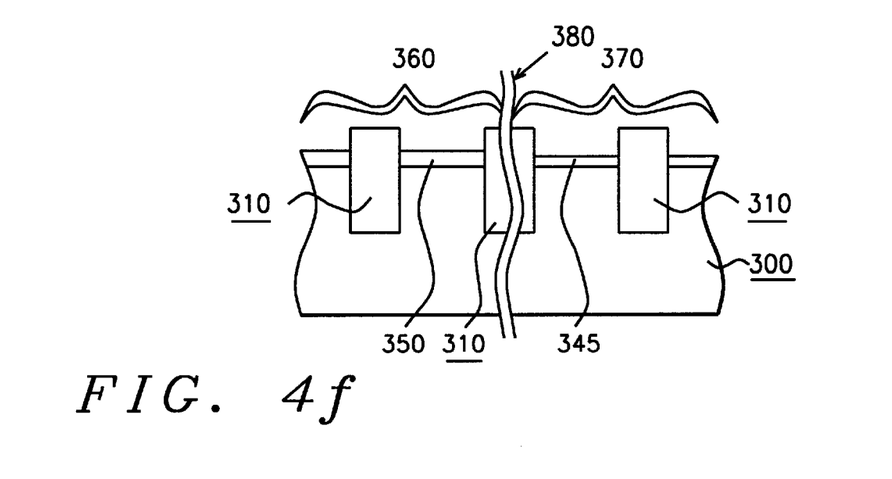
FIG. 4f is a cross-sectional view of a portion of a semiconductor substrate showing the forming of two different oxide layers of two different thicknesses over the HV and LV areas of the substrate of FIG. 2a with one oxidation step of the present invention.

Oxide layer (320) in HV area (320) is next removed by using HF dip, which will be known to those skilled in the art, and surface (305) reclaimed as shown in FIG. 4e. Then, as a key aspect of the invention, a one-step thermal oxidation of the entire substrate is performed at a temperature between about 600 to 1000° C., to form tunnel oxide (350) in the high-voltage HV area (360) shown in FIG. 4f. It will be noted that the presence of nitride layer (340) in the low-voltage LV area (370) limits the oxidation of silicon in the underlying substrate and thus enables a silicon dioxide layer of a limited thickness to be grown. This nitride rich oxide layer (345) is especially desirable for preventing boron penetration into the substrate at the subsequent steps of forming a polysilicon gate (not shown).

Though these numerous details of the disclosed method are set forth here, such as process parameters, to provide an understanding of the present invention, it will be obvious, however, to those skilled in the art that these specific details need not be employed to practice the present invention. At the same time, it will be evident that the same methods may be employed in other similar process steps that are too many to cite. For example, although a method of forming two oxide layers having two different thicknesses has been disclosed, same method can be employed to form a plurality, or multiple, of oxides of multiple thicknesses. The present invention provides one oxidation step to generate tunnel oxide for embedded non-volatile memory cells. It also provides $NH_3$ nitridation followed by re-oxidation to generate different oxide thicknesses by one step oxidation. The disclosed method avoids PR (photoresist) contamination of the tunnel oxide. Furthermore, in areas where generally twice the thickness of the oxide required, such as in high-voltage cell areas, than in the peripheral advanced logic areas, the method avoids degradation of the thinner oxide while the thicker oxide is grown. Also, since HF containing cleaning cannot be used over the low-voltage areas where thin oxide may be attacked severely, native oxide also cannot be removed, which is not the case with the disclosed method. It will be appreciated that for gate oxides thinner than 20 Å, native oxide may consume half of its thickness. Finally, though nitrogen implant into a substrate may be used to generate two different oxide thickness, that method need not be employed since nitrogen implant will induce degradation of the oxide integrity; instead the instant invention may be used.

While the invention has been particularly shown and described with reference to the preferred embodiments thereof, it will be understood by those skilled in the art that various changes in form and details may be made without departing from the spirit and scope of the invention.

What is claimed is:

1. A method of forming multiple oxide thicknesses with one step comprising the steps of:

providing a substrate having a first active area and a second active area separated by a trench isolation region;

performing nitridation to form a nitride layer over said substrate including over both said first and second active areas, wherein said nitridation is performed using $NH_3$ in an RTP at a temperature between about 600 to 1000° C.;

forming a masking layer over said nitride layer to protect a portion of said nitride layer overlying said second active area;

etching of said nitride layer over said first active area not protected by said masking layer;

removing said masking layer;

wet cleaning said substrate including said first and second active areas; and performing oxidation over said substrate including over said first and second active areas to form a tunnel oxide in one oxidation step over said first active area.

2. The method of claim 1, wherein said first active region is a high-voltage cell region, and said second active region is a low-voltage logic region.

3. The method of claim 1, wherein said nitride layer has a thickness between about 10 to 30 Å.

4. The method of claim 1, wherein said masking layer comprises photoresist having a thickness between about 1.0 to 3.0 μm.

5. The method of claim 1, wherein said etching a portion of said nitride layer is accomplished with a recipe comprising hot $H_3PO_4$ wet solution.

6. The method of claim 1, wherein said removing said masking layer is accomplished by oxygen plasma ashing.

7. The method of claim 1, wherein said wet cleaning comprises hydrogen fluoride, HF, solution.

8. The method of claim 1, wherein said oxidation is performed with a recipe comprising gases $H_2$ and $O_2$.

9. The method of claim 1, wherein said tunnel oxide has a thickness between about 80 to 110 Å.

10. A method of forming multiple oxide thicknesses with one step comprising the steps of:

providing a substrate having a first active area and a second active area separated by a trench isolation region;

forming a sacrificial oxide layer over said substrate including over said first and second active areas;

etching said sacrificial oxide layer over said second active area;

wet cleaning said substrate including said first and second active areas;

performing nitridation to form a nitride layer over said substrate, wherein said nitridation is performed using $NH_3$ in an RTP at a temperature between about 600 to 1000° C.;

removing said sacrificial oxide layer from over said first active area;

performing oxidation over said substrate including over said first and second active areas to form a tunnel oxide in one oxidation step over said first active area.

11. The method of claim 10, wherein said first active region is a high-voltage cell region, and said second active region is a low-voltage logic region.

12. The method of claim 10, wherein said sacrificial oxide layer is formed by thermally growing at a temperature between about 600 to 100° C.

13. The method of claim 10, wherein said sacrificial oxide has a thickness between about 50 to 80 Å.

14. The method of claim 10, wherein said wet cleaning is accomplished with a solution not containing HF.

15. The method of claim 10, wherein said nitride layer has a thickness between about 10 to 30 Å.

16. The method of claim 10, wherein said removing said sacrificial oxide layer is accomplished with a HF dip.

17. The method of claim 10, wherein said oxidation is performed with a recipe comprising gases $H_2$ and $O_2$.

18. The method of claim 10, wherein said tunnel oxide has a thickness between about 80 to 110 Å.

* * * * *